(12) United States Patent
Fujii et al.

(10) Patent No.: US 7,172,383 B2
(45) Date of Patent: Feb. 6, 2007

(54) WAFER TRANSFER EQUIPMENT AND SEMICONDUCTOR DEVICE MANUFACTURING APPARATUS USING WAFER TRANSFER EQUIPMENT

(75) Inventors: Koji Fujii, Hyogo-ken (JP); Tomoaki Takeuchi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/873,301

(22) Filed: Jun. 23, 2004

(65) Prior Publication Data

US 2005/0036862 A1 Feb. 17, 2005

(30) Foreign Application Priority Data

Jun. 23, 2003 (JP) ............................. 2003-178389

(51) Int. Cl.
*B65G 65/00* (2006.01)
(52) U.S. Cl. .................... 414/416.02; 414/811
(58) Field of Classification Search ........... 414/416.02, 414/811
See application file for complete search history.

(56) References Cited

U.S. PATENT DOCUMENTS

| | | | | |
|---|---|---|---|---|
| 4,611,966 A | * | 9/1986 | Johnson | 414/404 |
| 4,987,407 A | * | 1/1991 | Lee | 340/540 |
| 5,188,499 A | * | 2/1993 | Tarng et al. | 414/404 |
| 5,193,969 A | * | 3/1993 | Rush et al. | 414/404 |
| 5,370,142 A | * | 12/1994 | Nishi et al. | 134/61 |
| 5,620,295 A | * | 4/1997 | Nishi | 414/416.11 |
| 5,692,869 A | * | 12/1997 | Kumagai | 414/404 |
| 5,887,604 A | * | 3/1999 | Murakami et al. | 134/102.2 |
| 6,053,694 A | * | 4/2000 | Dill | 414/778 |
| 6,193,459 B1 | * | 2/2001 | Rush | 104/35 |
| 6,769,855 B2 | * | 8/2004 | Yokomori et al. | 414/416.02 |

FOREIGN PATENT DOCUMENTS

| | | |
|---|---|---|
| JP | 2001-168172 | 6/2001 |
| JP | 3260160 | 12/2001 |
| JP | 2002-19814 | 7/2002 |

* cited by examiner

*Primary Examiner*—Thomas J Brahan
(74) *Attorney, Agent, or Firm*—Finnegan, Henderson, Farabow, Garrett & Dunner, L.L.P.

(57) ABSTRACT

A semiconductor wafer transfer equipment transfers a plurality of semiconductor wafers, held in grooves of carriers in an erected state, to a boat using first and second wafer elevators equipped with a comb-teeth portion and a wafer grip and transfer unit. The first and second wafer elevators correspond to the carriers and the boat and are equipped with a position correction mechanism which corrects positions of comb-teeth openings of comb-teeth members provided on the comb-teeth portion, corresponding to semiconductor wafers housed in the grooves of the carriers.

5 Claims, 6 Drawing Sheets

WAFER TRANSFER EQUIPMENT AND SEMICONDUCTOR DEVICE MANUFACTURING APPARATUS USING WAFER TRANSFER EQUIPMENT

CROSS-REFERENCE TO RELATED APPLICATIONS

This application is based upon and claims the benefit of priority from the prior Japanese Patent Application No. 2003-178389, filed on 23rd June, 2003; the entire contents of which are incorporated herein by reference.

BACKGROUND OF THE INVENTION (1) Field of the Invention

The present invention relates to a wafer transfer equipment that is used when, for example, semiconductor wafers are transferred to a batch processing between wafer carriers and boats and a semiconductor device manufacturing apparatus using this wafer device transfer equipment.

(2) Description of the Related Art

A conventional technology will be described below referring to FIG. 12 and FIG. 13. A semiconductor wafer transfer equipment is provided with a first wafer elevator 3 that moves up and down from an internal specific position in a main body 2 of the equipment 1 to an external position at a specific height and a second wafer elevator 4 that moves up and down separately from the first wafer elevator 3. Between first and second wafer elevators 3 and 4, a wafer grip and transfer unit 5 is provided. A comb-teeth portion 7 is provided on the top of an elevating shaft 6 that is driven by an elevator drive unit (not shown) of first and second semiconductor wafer elevators 3 and 4, respectively. This comb-teeth portion 7 is provided with almost two symmetrically arranged comb-teeth members 8 and 9 with a comb-teeth opening formed to expand upward and the row of comb-teeth members set in the horizontal direction.

Wafer grip and transfer unit 5 is provided with a T-shaped supporting stay 10 at the upper side of main body 2 and a wafer gripper 12 that moves back and forth between the points directly above first wafer elevator 3 and the second wafer elevator 4 along a horizontal arm member 11 on the top of the supporting stay 10. Wafer gripper 12 has a gripping unit 14 comprising a pair of grippers 13a and 13b at the lower portion to grip a wafer and a drive unit 15 for the gripping operation of unit 14 and the reciprocation along horizontal arm member 11 at the upper portion.

The wafer transfer operations of the wafer transfer equipment are as described below. First, comb-teeth portions 7 of first and second wafer elevators 3,4 are positioned in main body 2 of the equipment and carriers 18 with semiconductor wafers 16 inserted in plural grooves 17 in the erected state are placed on the top surface of main body 2 so as to position immediately above comb-teeth portion 7 of first wafer elevator 3. Similarly, an empty boat 19 is placed on the top surface of main body 2 of the equipment to take in transferred semiconductor wafers 16 so as to position directly above comb-teeth portion 7 of second wafer elevator 4.

Then, elevating shaft 6 of first elevator 3 is moved up and semiconductor wafers 16 taken in carrier 18 are held one by one in the comb-teeth portions of comb-teeth members 8, 9 opposing to comb-teeth portions 7. Wafer gripper 12 of wafer grip and transfer unit 5 is positioned immediately above carrier 18, wafer grippers 13a and 13b are opened to readily grip wafers, and comb-teeth portion 7 is moved up to the wafer grip position with wafer gripper 12 by elevating shaft 6 of first wafer elevator 3. In succession, semiconductor wafers 16 are gripped by wafer grippers 13a and 13b, and comb-teeth portion 7 of first wafer elevator 3 is moved down.

Thereafter, wafer gripper 12 holding a semiconductor wafer 16 is moved horizontally to a position immediately above boat 19. Comb-teeth portion 7 is moved up by elevating shaft 6 of second wafer elevator 4 and is made to readily hold semiconductor wafer 16 in the comb-teeth openings 34 of comb-teeth members 8 and 9 one by one. Gripping of semiconductor wafer 16 by wafer holder 12 is cancelled and held by comb-teeth portion 7 of second wafer elevator 4.

Then, comb-teeth portion 7 of second wafer elevator 4 is moved down into the inside of main body 2. Semiconductor wafers 16 are transferred into boat 19 and the transfer of semiconductor wafers 16 into boat 19 from carriers 18 is finished. Semiconductor wafers 16 held in boat 19 are conveyed to, for example, a diffusion furnace/CVD system (not illustrated) and a specified processing is applied. Processed semiconductor wafers 16 are hung on semiconductor transfer equipment 1 and after the processing reverse to the above-mentioned process, transferred into carrier 18 and held therein.

In the conventional technology described above, it was necessary to pre-adjust the positions of grooves 17 holding semiconductor wafers 16 in the erected state to accurately agree with the comb-teeth opening positions of comb-teeth members 8 and 9 opposing to comb-teeth portion 7 of first wafer elevator 3. Thus, an accurate adjustment for the pre-positioning was required and labor hour and time were needed for the position adjustment.

BRIEF SUMMARY OF THE INVENTION

According to an embodiment of the present invention, an object of the invention is to obtain a wafer transfer equipment capable of relatively easily aligning the groove positions of wafer carriers with comb-teeth opening positions and a semiconductor device manufacturing apparatus using this wafer transfer equipment.

The present invention may provide a wafer transfer equipment, comprising:

first and second wafer carriers with grooves formed to hold a number of wafers in the erected state in the grooves;

first and second wafer elevators equipped with comb-teeth portions to hold the wafers and provided corresponding to the first and second wafer carriers;

a wafer transfer unit to transfer a number of wafers from one of wafer carriers to another wafer carrier, and further, the first and second wafer elevators are provided with a position correction mechanism to correct the positions of the comb-teeth members corresponding to wafers held in the grooves of the first and second wafer carriers.

The present invention may provide a semiconductor device manufacturing apparatus equipped with wafer transfer equipment, wherein the wafer transfer equipment is composed of:

first and second wafer carriers with grooves formed to hold a number of wafers therein in the erected state;

first and second wafer elevators provided corresponding to the first and the second wafer carriers and equipped with comb-teeth portions to hold the wafers;

a wafer transfer unit to transfer a number of wafers from one of the wafer carriers to the other wafer carrier and further, the comb-teeth portions of the first and second wafer elevators are at positions corresponding to wafers held in the grooves of the first and the second wafer carriers and a position correction mechanism is provided to correct the positions of the comb-teeth members by moving back and forth in the comb-teeth direction when the wafer touch the comb-teeth members.

DETAILED DESCRIPTION OF THE INVENTION

Figure 1:
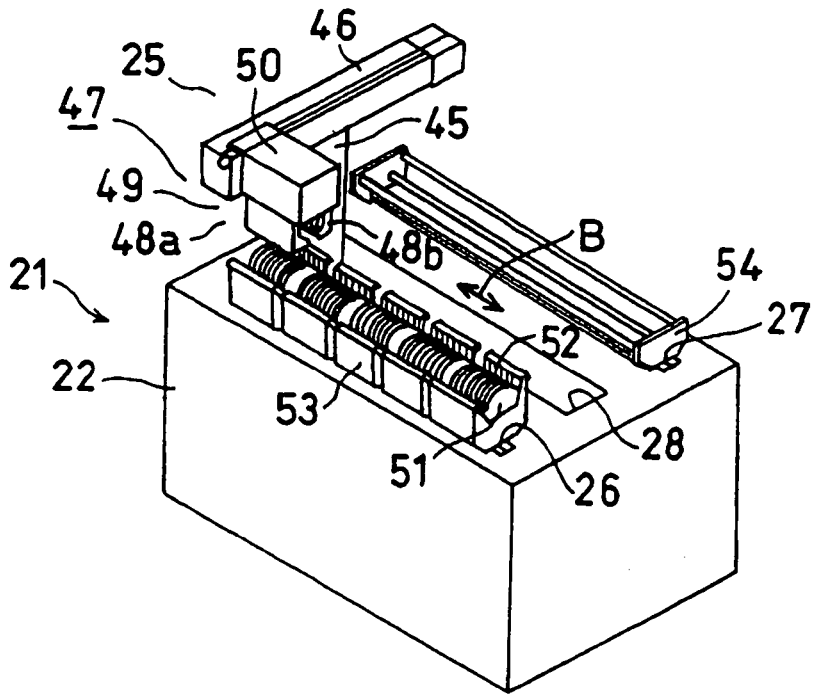
FIG. 1 is a perspective view showing one embodiment of the present invention.
Figure 2:
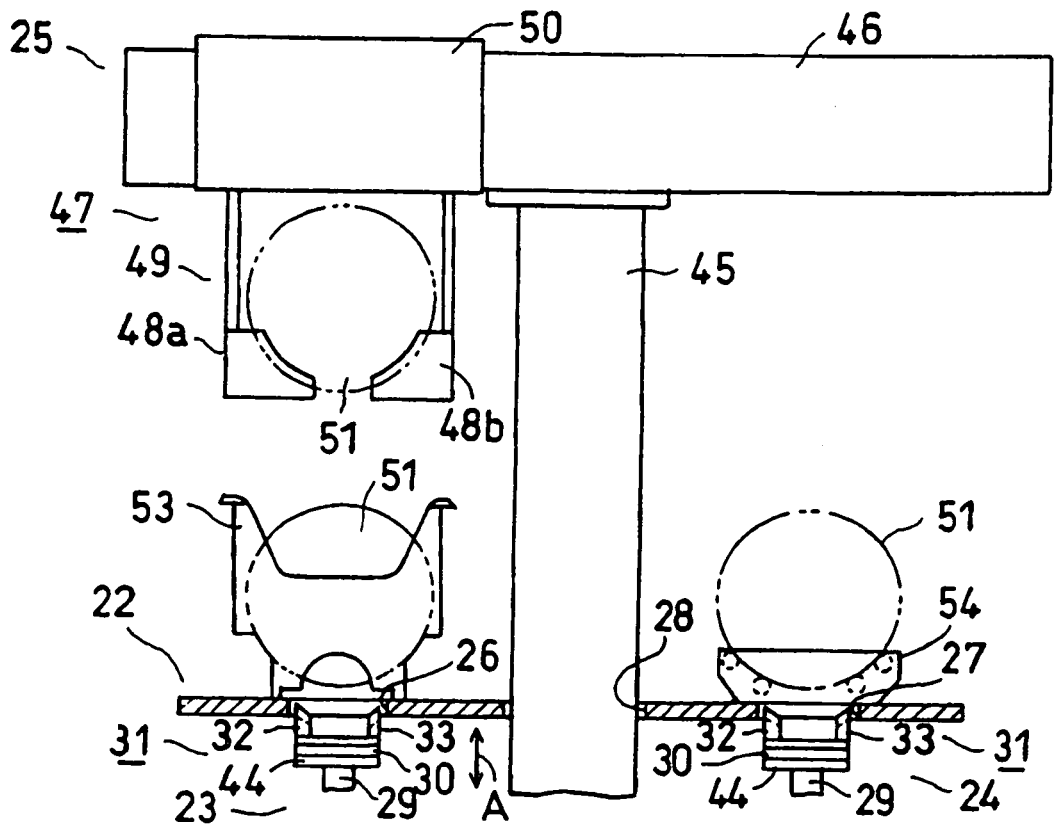
FIG. 2 is a front view of essential portions in one embodiment of the present invention.
Figure 3:
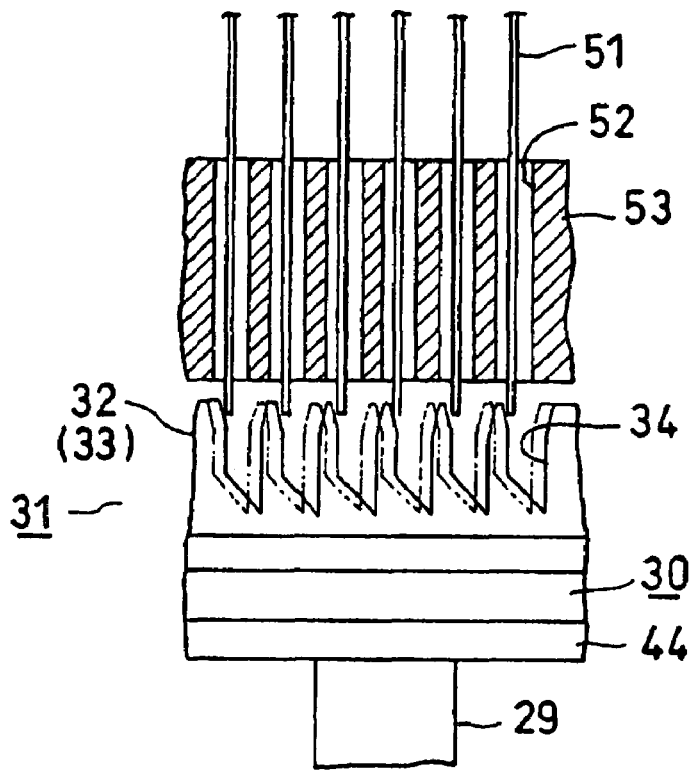
FIG. 3 is a diagram showing the state of the wafer elevators to hold semiconductor wafers with the comb-teeth members in one embodiment of the present invention.
Figure 4:
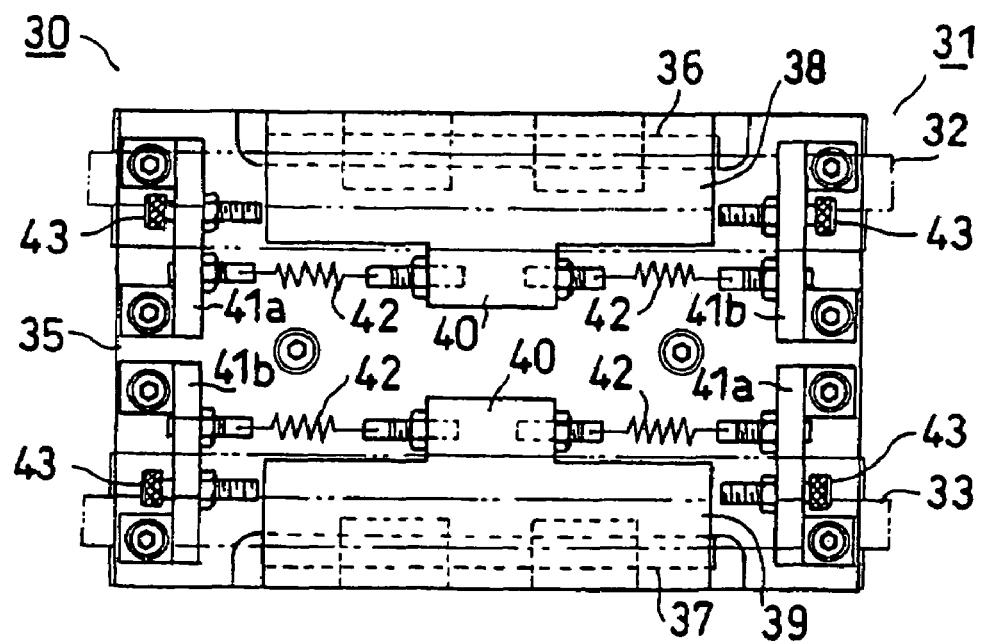
FIG. 4 is a plan view of a position correction mechanism in one embodiment of the present invention.
Figure 5:
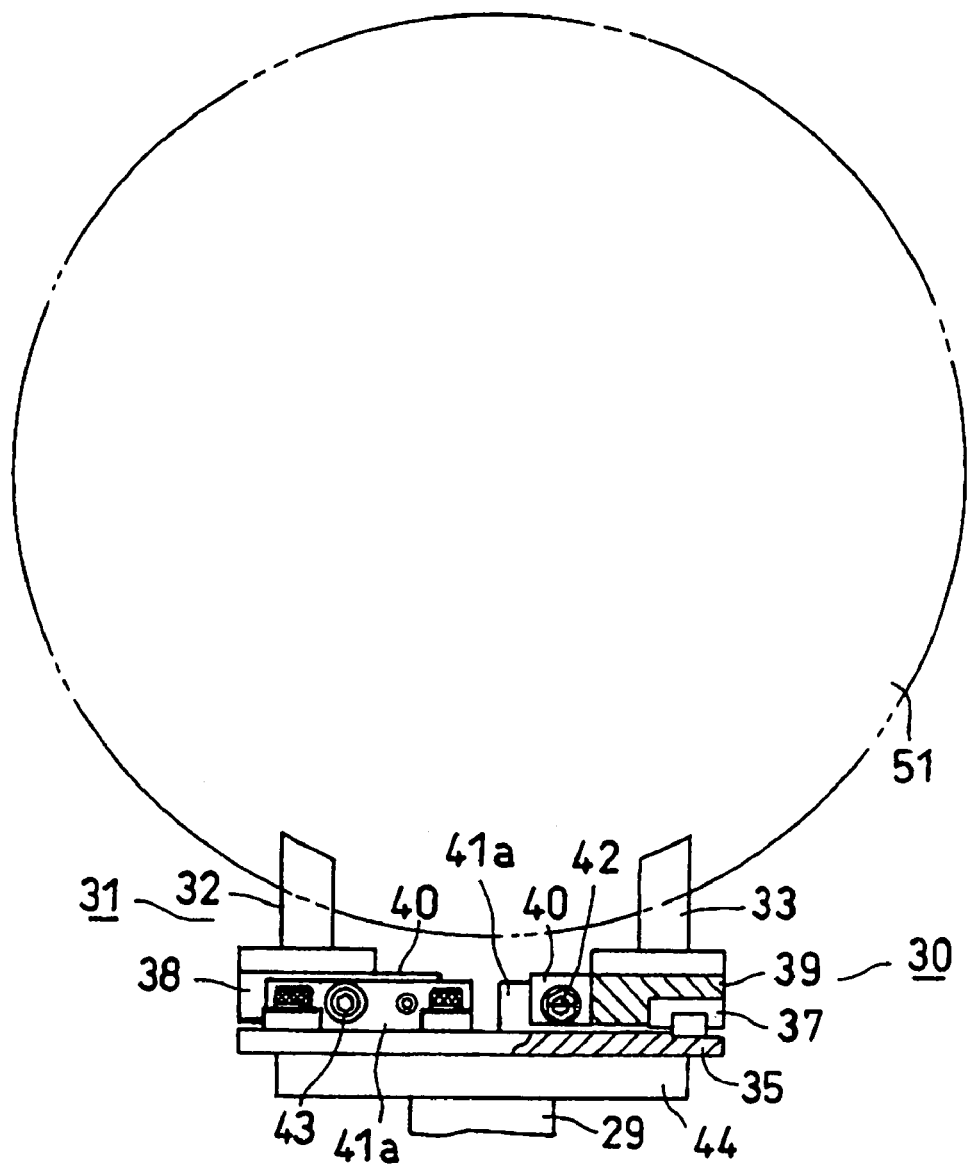
FIG. 5 is a front view of a position correction mechanism in one embodiment of the present invention.
Figure 6:
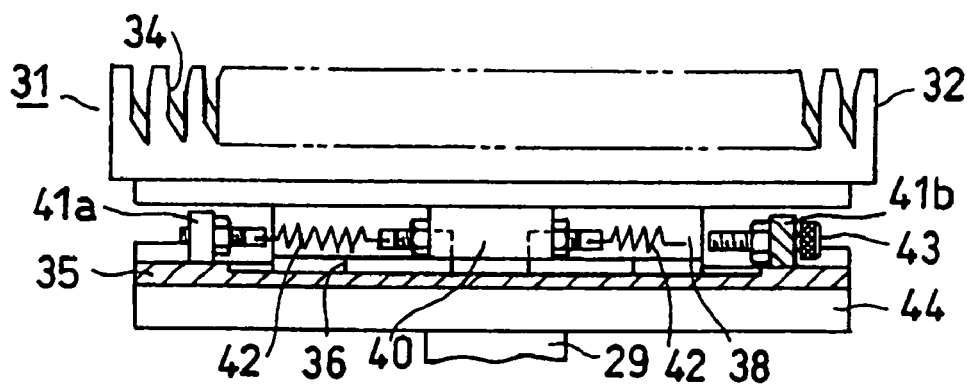
FIG. 6 is a side view of a position correction mechanism in one embodiment of the present invention.

One embodiment of the present invention will be described below referring to FIG. 1 through FIG. 11. 21 is a semiconductor wafer transfer equipment that is used in such processes as a diffusion process or CVD process. Semiconductor wafer transfer equipment is provided with a first wafer elevator 23 and a second wafer elevator 24, separately on a main body 2. Further, a wafer transfer unit 25 is provided between both wafer elevators 23 and 24. First and second wafer elevators 23 and 24 move through first and second elevating rectangular openings 26 and 27 on the top of main body 22 up and down as shown by an arrow A with a drive unit (not illustrated) provided in main body 22 from the inner specified position to an external position at a specified height. Further, first and second wafer elevators 23 and 24 move back and forth in the longitudinal opening direction that is the cross direction of main body 22, as shown by the arrow B.

Wafer transfer unit 25 is also moved back and forth in the longitudinal direction of a rectangular transfer opening 28 on the top of main body 22 by a drive unit (not shown) provided in main body 22 in sync with the reciprocating movement in the cross direction of first and second wafer elevators 23 and 24, as shown by the arrow B.

First wafer elevator 23 and second wafer elevator 24 are provided with a comb-teeth portion 31 at the top of an elevating shaft 29 that is moved up/down and back and forth by respective drive units with a position correction mechanism 30 provided between them. Comb-teeth portion 31 is composed of two symmetrically arranged comb-teeth members 32 and 33 with comb-teeth openings 34 formed to expand upward and the comb-teeth members 32 and 33 arranged in the horizontal direction. The bottom portion of comb-teeth opening 34 is tilted in the comb-teeth direction at one side.

Position correction mechanism 30 has two linear guide members 36 and 37 at the opposing positions on a substrate 35 so that the guiding directions become parallel to each other. On guide members 36 and 37, two almost T-shaped comb mounting bases 38 and 39 are fixed symmetrically so that projecting portions 40 become opposite to each other. On comb-shaped mounting bases 38 and 39, comb-teeth members 32 and 33 are fixed with the respective comb-teeth openings opposed to each other and the comb-teeth direction aligned with the guide direction of guide members 36 and 37. On substrate 35, fixing brackets 41a, 41b are screwed at both sides in the guide direction of guide members 36 and 37.

Between fixing brackets 41a, 41b and the surfaces of projecting portions 40 of comb mounting bases 38 and 39, a tensile elastic member, for example, a tensile coil spring 42 with an adjusting screw is mounted so that a pressing force can be adjusted. Thus, comb mounting bases 38 and 39 are arranged almost at the center of substrate 35 in the guide range by the guide members 36 and 37 as a neutral point. Fixing brackets 41a and 41b are provided with a stopper bolt 43 as a position control member that is capable of adjusting the control position and the moving range of comb mounting bases 38 and 39 is regulated to the specified range. Position correction mechanism 30 is fixed to a mounting member 44 at the top of elevating shaft 29 with a mounting screw.

Wafer transfer unit 25 extends to the upper side of main body 22. Wafer transfer unit 25 is equipped with a strut 45 and a wafer gripper 47. Strut 45 is in a T-shape and is moved back and forth in transfer opening 28, in sync with the movement of first and second wafer elevators 23 and 24 in the corresponding elevating openings 26 and 27. Wafer gripper 47 reciprocates between the points immediately above first wafer elevator 23 and second wafer elevator 24, along a horizontal arm member 46 at the upper portion of strut 45. Wafer gripper 47 has a wafer grip unit 49 and a drive unit 50. Wafer grip unit 49 is located below wafer gripper 47 and is provided with a pair of gripping members 48a and 48b for gripping wafers. Drive unit 50 is located above the wafer gripper 47 for the grip operation of grip unit 49 and the reciprocating movement along a horizontal arm member 46. On wafer gripping members 48a and 48b, the gripping groove (not illustrated), in the same pitch as comb-teeth openings 34 of comb-teeth members 32 and 33, is engraved to grip semiconductor wafers.

The semiconductor wafer transfer operations in the semiconductor device manufacturing apparatus in the structure described above are as shown below.

Figure 7:
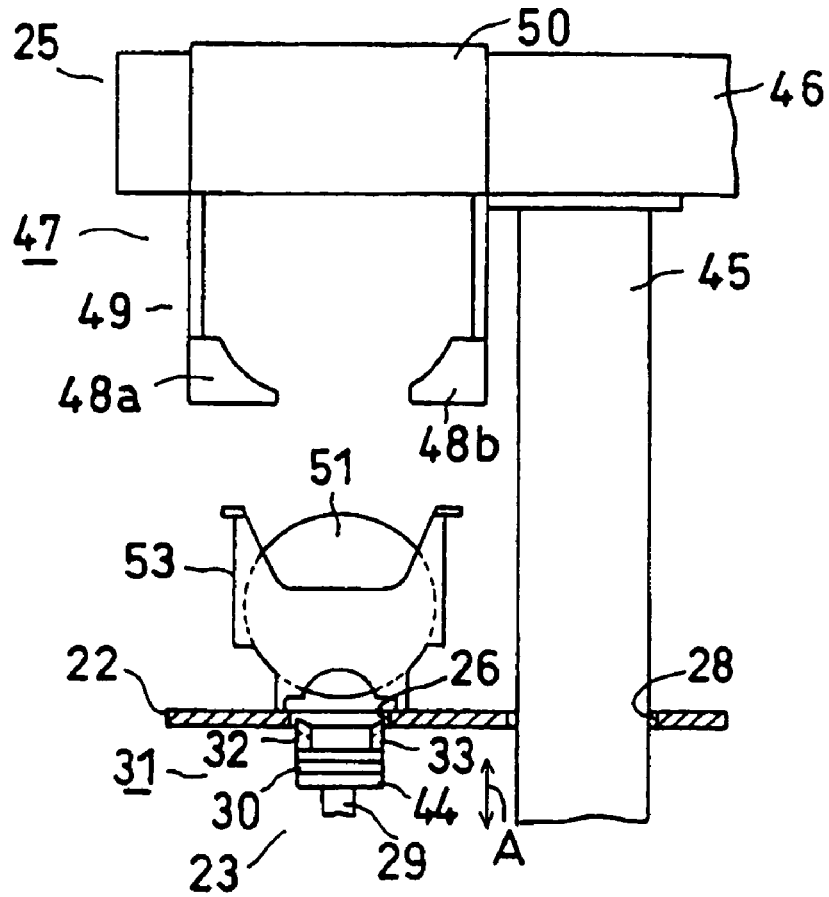
FIG. 7 is a front view of essential portions showing the first wafer transfer process in one embodiment of the present invention.

First, in the first wafer transferring process shown in FIG. 7, comb-teeth portion 31 of first wafer elevator 23 is positioned at a specified position that is the operation start point in main body 22 of the apparatus. Carrier 53, that is a first wafer carrier with plural semiconductor wafers 51 put in a number of grooves in the erected state, is placed on the top of main body 22 to stride first elevating opening 26 and arranged in the longitudinal direction of opening 26. The principal surfaces of semiconductor wafers 51 become orthogonal to the longitudinal direction of first elevating opening 26, and semiconductor wafers 51 put in carrier 53, that are to be first transferred, are arranged about immediately above comb-teeth openings 34 of comb-teeth members 32 and 33 opposite to each other of comb-teeth portion 31 of first wafer elevator 23.

Wafer gripper 47 of wafer transfer equipment 25 is positioned directly above carrier 53 from which wafers are transferred first and grippers 48a and 48b are opened to the state ready to grip wafers. Further, comb-teeth portion 31 of second wafer elevator 24 is positioned at a specified position in main body 22. Further, an empty boat 54, that is a second wafer carrier to take transferred semiconductor wafers 51, is placed on the top surface of main body 22 of the apparatus so that the principal surfaces of semiconductor wafers 51 become orthogonal to the longitudinal direction of second elevating opening 27 and immediately above comb-teeth openings 34 of opposing comb-teeth members 32 and 33 of second wafer elevator 24 when semiconductor wafers 51 are put in plural grooves (not shown) in the erected state. Grooves 52 formed on carriers 53 and grooves of boat 54 are in the same pitch as those of comb-teeth openings 34 of comb-teeth members 32 and 33.

Figure 8:
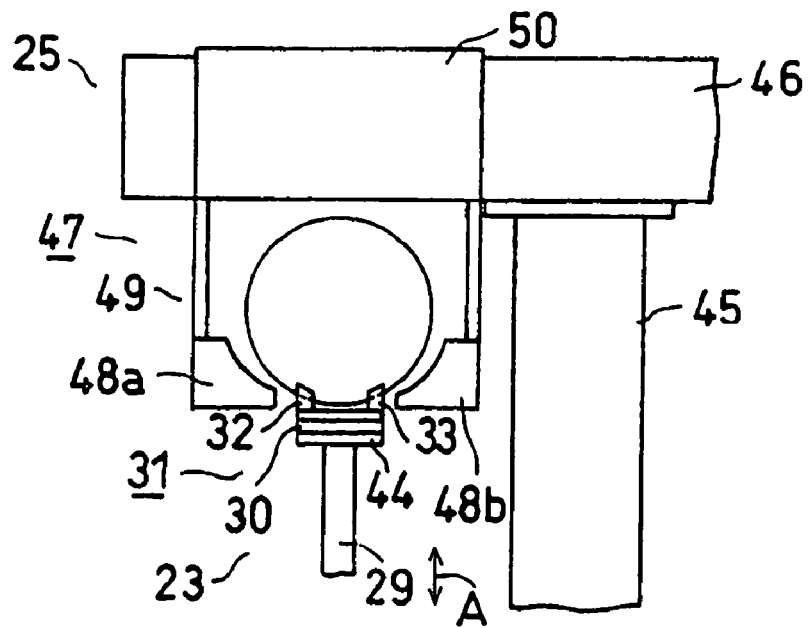
FIG. 8 is a front view of essential portions showing the second wafer transfer process in one embodiment of the present invention.

Then, in the second wafer transfer processing shown in FIG. 8, comb-teeth portion 31 is moved up from the specified position in main body 22 of the apparatus by raising elevating shaft 29 of first wafer elevator 23, and semiconductor wafers 51 put in carrier 53 are held one by one in the comb-teeth openings 34 of opposing comb-teeth members 32 and 33 of comb-teeth portion 31. Thereafter, by further raising elevating shaft 29 of first wafer elevator 23, comb-teeth portion 31 holding semiconductor wafers 51 is moved to the gripping position by wafer gripper 47, that is made ready to grip wafers with grippers 48a and 48b opened.

Further, if there are semiconductor wafers 51, part of which were deformed and set in carrier 53 in the displaced state when they were held by comb-teeth portion 31, the front edges of comb-teeth openings 34 of comb-teeth members 32 and 33 contact displaced semiconductor wafers 51. As a result of the upward moving of comb-teeth portion 31, comb-teeth members 32 and 33 pull one of coil springs 42 that are in the neutral state and are moved in the comb-teeth direction, as shown by a two-dotted chain line in FIG. 3. Position correction mechanism 30 acts, and semiconductor wafers 51 are held smoothly in comb-teeth openings 34 without unreasonable force applied. As shown by the two-dotted chain line, comb-teeth portion 31 moved in the comb-teeth direction is restored later to the original position by the pressing force of the pulled one of coil spring 42.

Figure 9:
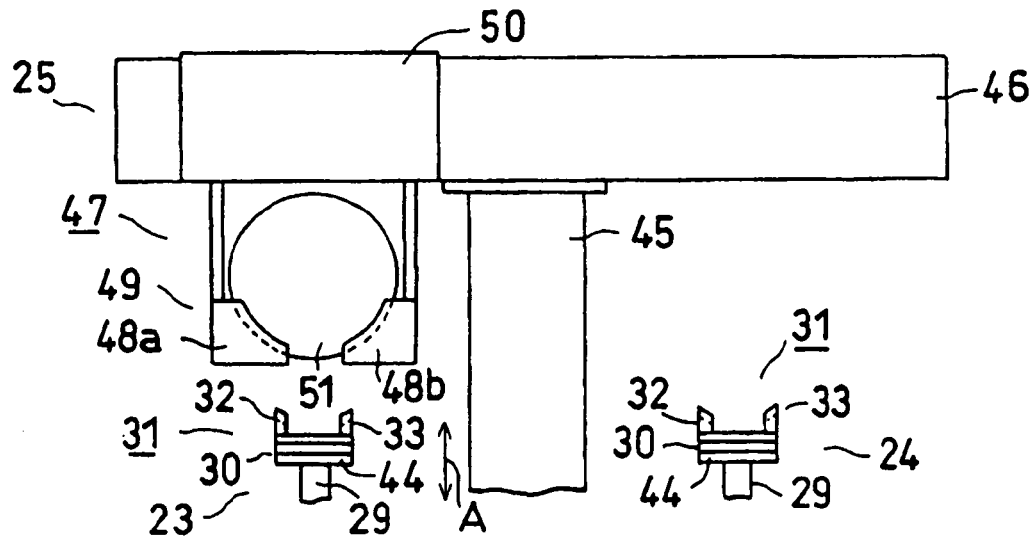
FIG. 9 is a front view of essential portions showing the third wafer transfer process in one embodiment of the present invention.

In the third wafer transfer process shown in FIG. 9, grip unit 49 is actuated to make the grip operation by operating drive unit 50 of wafer gripper 47, and semiconductor wafers 51 are gripped with grippers 48a and 48b that have grip grooves. Thereafter, elevating shaft 29 of first wafer elevator 23 is moved down and comb-teeth portion 31 is moved down to a specified position in main body 22 of the apparatus.

Figure 10:
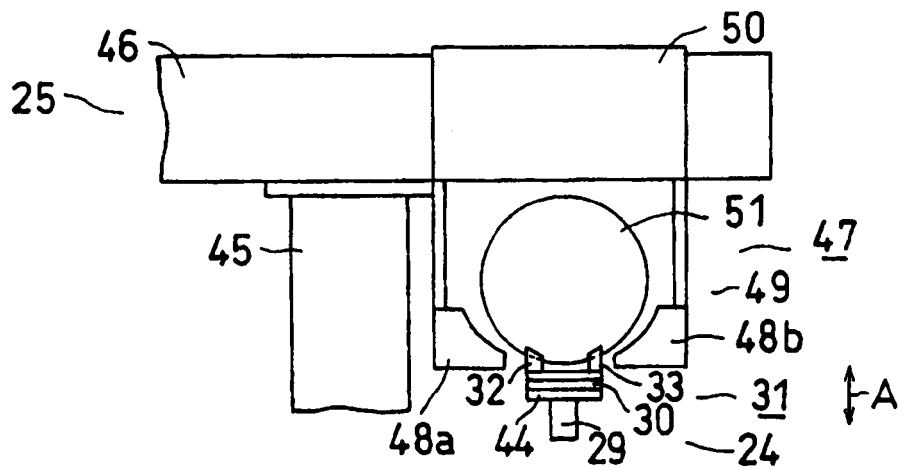
FIG. 10 is a front view of essential portions showing the fourth wafer transfer process in one embodiment of the present invention.

Then, in the fourth wafer transfer process shown in FIG. 10, wafer gripper 47 gripping semiconductor wafer 51 is moved horizontally to the position immediately above boat 54, along horizontal arm member 46, by operating drive unit 50 of wafer gripper 47. In succession, comb-teeth portion 31 is moved up to the position to grip semiconductor wafers 51 by wafer grip member 47 from the specified position in main body 22 by moving elevating shaft 29 of second wafer elevator 24 up.

Semiconductor wafers 51 gripped by wafer gripper 47 are made to the state ready to hold wafers one by one in comb-teeth openings 34 of comb-teeth members 32 and 33 opposing to comb-teeth portion 31. In succession, semiconductor wafers 51 gripped by wafer gripper 47 are released and held in comb-teeth openings 34 of comb-teeth members 32 and 33 of comb-teeth portion 31, provided to second wafer elevator 24. At this time, similar to the second wafer transfer processing described above, if semiconductor wafers 51 held by wafer gripper 47 are displaced, position correction mechanism 30 is actuated and semiconductor wafers 51 are smoothly held in comb-teeth openings 34 of comb-teeth members 32 and 33 of comb-teeth portion 31 without unreasonable force applied.

Figure 11:
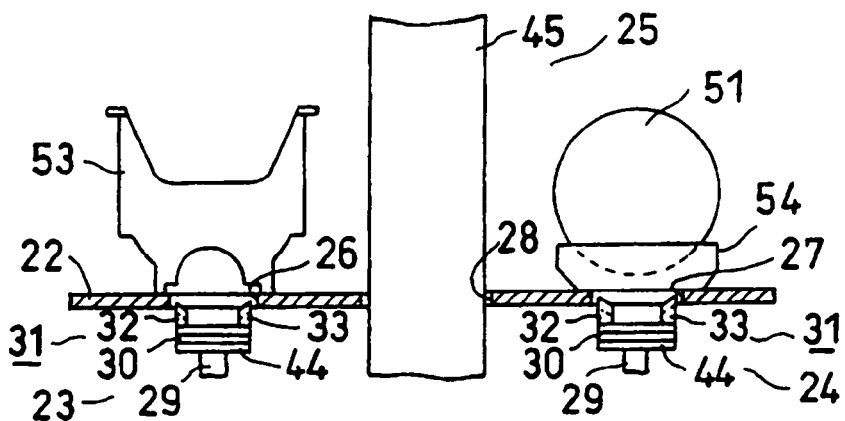
FIG. 11 is a front view of essential portions showing the fifth wafer transfer process in one embodiment of the present invention.
Figure 12:
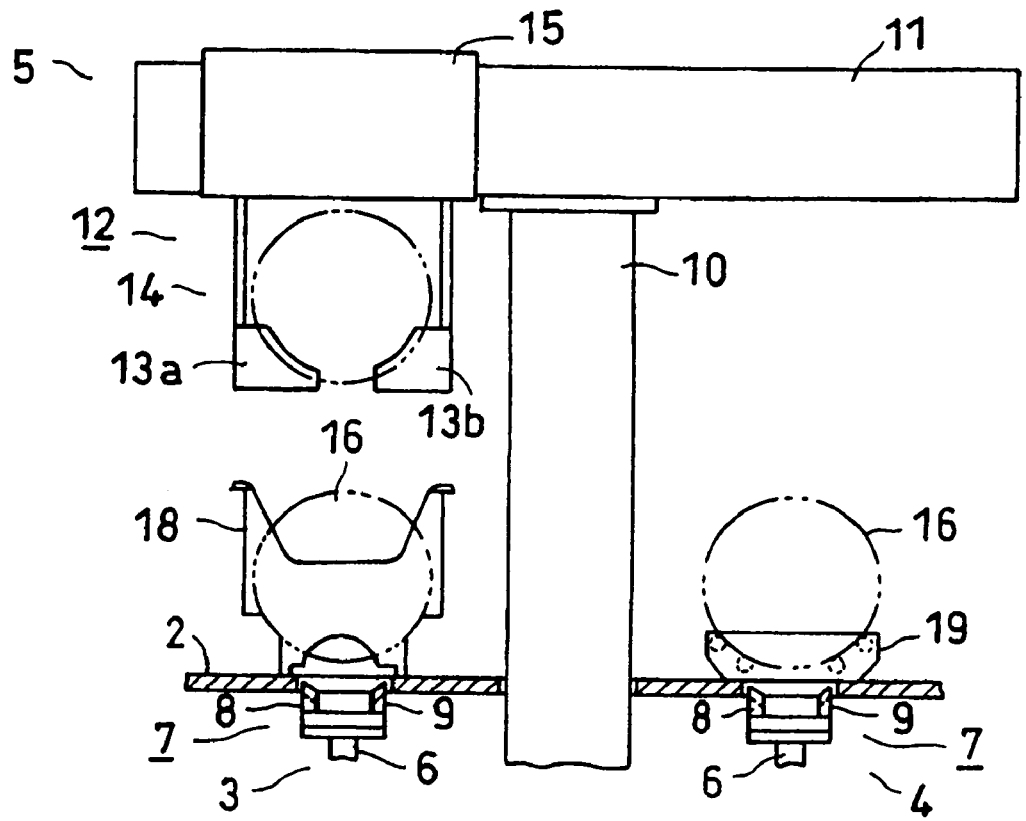
FIG. 12 is a front view of essential portions of a conventional technology.
Figure 13:
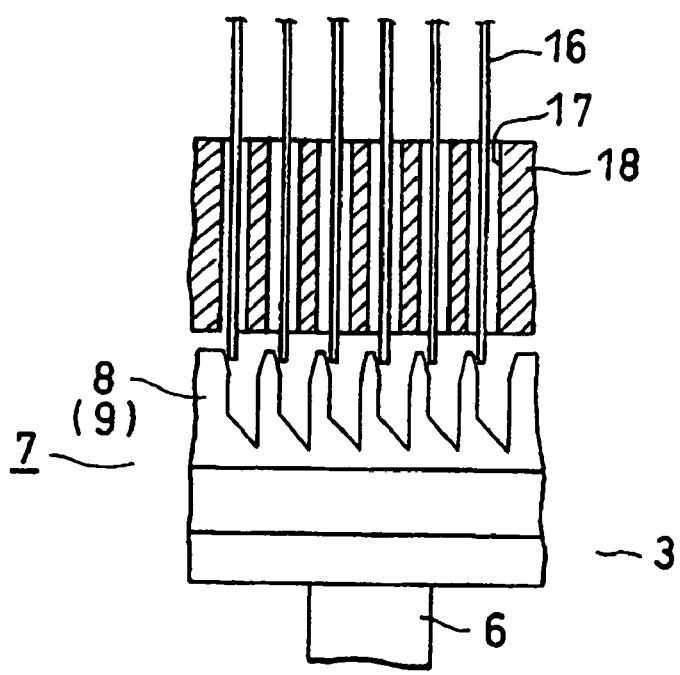
FIG. 13 is a diagram showing the state to hold semiconductor wafers with comb-teeth members of a wafer elevator in a conventional technology.

Then, in the fifth wafer transfer process shown in FIG. 11, elevating shaft 29 of second wafer elevator 24 is moved down and comb-teeth portion 31 is moved to a specified position in main body 22 from the grip position. In this downward moving process, semiconductor wafers 51 held in comb-teeth portion 31 are put in corresponding grooves of boat 54 placed on main body 22 of the apparatus. At this time, if the positions of the grooves of boat 54 and the positions of semiconductor wafers 51 held by comb-teeth portion 31 are not aligned, position correction mechanism 30 acts similar to the second process described above, and wafers 51 are put in boat 54 smoothly without unreasonable force applied.

After the plurality of semiconductor wafers 51 held in first carrier 53 are transferred through the above-mentioned processes, first and second wafer elevators 23, 24 and wafer transfer unit 25 are moved in the direction shown by the arrow B to the next transfer carrier 53 by the drive unit. By executing the processes from the first through the fifth processes repetitively, by changing carriers 53, semiconductor wafers 51 can be transferred to boat 54 from carriers 53 placed on main body 22 of the apparatus.

Thereafter, semiconductor wafers 51 held in boat 54 are conveyed to, for example, a diffusion furnace, CVD apparatus, etc. and applied with a specified process. After completing the process, semiconductor wafers 51 are hung over semiconductor transfer equipment 21 in the state held in boat 54, and transferred to and held in carriers 53 after repeatedly applied with the processes almost reverse to the above-mentioned processes.

In the structure described above, even when positions of grooves 52 of carrier 53 to house or grip semiconductor wafers 51, grooves of boat 54, gripping grooves of wafer gripper 47, or positions of comb-teeth openings 34 of opposing comb-teeth members 32 and 33 of comb-teeth portion 31 of first and second wafer elevators 23 and 24 are not aligned accurately and slightly displaced, it is possible to house or grip semiconductor wafers 51 certainly, while automatically adjusting the positions by position correction mechanism 30. Thereafter, they are automatically restored to original positions, not much labor and time are needed for adjusting positions in the position alignment, and it becomes easy to handle the apparatus.

Even when semiconductor wafers 51 are warped or deformed or manufacturing errors exist in carriers 53, boat 54, or wafer gripper 47, positions of carriers 53 or boats 54 are automatically compensated by position correction mechanism 30, and it is therefore possible to smoothly house and grip semiconductor wafers 51. Accordingly, the possibility for generating dust caused from friction of semiconductor wafers with groove walls is reduced. Further, it is also possible to suppress generation of flaw, crack, etc. of semiconductor wafers 51.

According to a wafer transfer equipment and a semiconductor device manufacturing apparatus involved in one embodiment of the present invention, positions of grooves of wafer carriers and positions of comb-teeth members can be aligned relatively simply.

It goes without saying that various obvious modifications and simple variants come within the scope of the present invention beyond the above-described embodiment.

What is claimed is:

1. A wafer transfer equipment, comprising:
    first and second wafer carriers with grooves to hold a plurality of wafers in the grooves in an erected state;
    first and second wafer elevators each equipped with a comb-teeth portion to hold the plurality of wafers and provided to correspond to the first and second wafer carriers, each of the comb-teeth portions including comb-teeth members; and
    wafer transfer units to transfer the plurality of wafers from the first wafer carrier to the second wafer carrier;
    wherein the first and the second wafer elevators are further equipped with a position correction mechanism to correct positions of the comb-teeth members by moving the comb-teeth members back and forth in a direction along which the comb-teeth members are arranged when the plurality of wafers held in the grooves of the first or second wafer carriers touch the comb-teeth members of the first or second wafer elevators, respectively.

2. The wafer transfer equipment as set forth in claim 1, wherein the position correction mechanism has a function to automatically return the comb-teeth members to original positions after the position correction.

3. The wafer transfer equipment as set forth in claim 1, wherein the position correction mechanism is equipped with a guide member to guide the movement of the comb-teeth members in the comb-teeth direction and an elastic member that is pressed to pull the comb-teeth members in the comb-teeth direction and a reverse direction, and automatically return the comb-teeth members to original positions.

4. The wafer transfer equipment as set forth in claim 1, wherein the first and second wafer elevators and the wafer transfer units hold and transfer the plurality of wafers at the same time.

5. A semiconductor device manufacturing apparatus equipped with a wafer transfer equipment, wherein
    the wafer transfer equipment comprises:
    first and second wafer carriers with grooves formed to hold a plurality of wafers in the grooves in an erected state;
    first and second wafer elevators equipped with comb-teeth portions to hold the plurality of wafers and provided to correspond to the first and second wafer carriers, each of the comb-teeth portions including comb-teeth members; and
    a wafer transfer unit to transfer the plurality of wafers from the first wafer carrier to the second wafer carrier;
    wherein the comb-teeth portions of the first and the second wafer elevators are at positions corresponding to the plurality of wafers held in the grooves of the first and second wafer carriers, and the first and second wafer elevators are further equipped with a position correction mechanism to correct positions of the comb-teeth members by moving the comb-teeth members back and forth in a direction along which the comb-teeth members are arranged when the plurality of wafers touch the comb-teeth members.

* * * * *